United States Patent
Tanaka et al.

[11] Patent Number: 6,042,653
[45] Date of Patent: Mar. 28, 2000

[54] SUSCEPTOR FOR BEARING AN OBJECT TO BE PROCESSED THEREON

[75] Inventors: Sumi Tanaka; Nobutaka Nakajima; Masato Koizumi, all of Yamanashi-ken, Japan

[73] Assignee: Tokyo Electron Limited, Tokyo, Japan

[21] Appl. No.: 09/093,430

[22] Filed: Jun. 8, 1998

[30] Foreign Application Priority Data

Jun. 11, 1997 [JP] Japan ................................. 9-167886

[51] Int. Cl.$^7$ ................................................. C23C 16/00
[52] U.S. Cl. ........................................... 118/728; 118/500
[58] Field of Search ..................................... 118/500, 728

[56] References Cited

U.S. PATENT DOCUMENTS 5,620,525  4/1997  van de Ven et al. ................... 118/728
5,738,751  4/1998  Camerson ............................ 118/728 X

FOREIGN PATENT DOCUMENTS 8-181195  7/1996  Japan .

Primary Examiner—Leo B. Tentoni
Attorney, Agent, or Firm—Graham & James LLP

[57] ABSTRACT

A susceptor according to the present invention is set in a process chamber for subjecting an object to a specific process and can bear the object thereon. The susceptor includes a stepped section for defining a recessed bearing region capable of bearing the object therein and positioning the object on the susceptor, and at least one groove formed in the bearing region and used to allow a gas remaining in a gap between the object and that part of the susceptor which includes the stepped section to get out of the bearing region.

9 Claims, 3 Drawing Sheets

SUSCEPTOR FOR BEARING AN OBJECT TO BE PROCESSED THEREON

BACKGROUND OF THE INVENTION

The present invention relates to a susceptor set in a process chamber and capable of bearing an object to be processed thereon, and more particularly, to a susceptor capable of preventing the object from being dislocated as the pressure in the process chamber varies.

Semiconductor manufacturing processes include a film-forming process, in which W (tungsten), WSi (tungsten silicide), Ti (titanium), TiN (titanium nitride), TiSi (titanium silicide) or some other metal or metallic compound is deposited on a semiconductor wafer (hereinafter referred to as "wafer") as an object to be processed by the CVD method, in order to form a wiring pattern on the wafer or fill up recesses between wires.

A process apparatus for carrying out this film-forming process is provided with a process chamber and a susceptor therein. The susceptor is formed of a thin carbon material or ceramics. Halogen lamps or the like for heating the wafer through a permeable window of quartz are arranged under the susceptor. The susceptor is facing by a showerhead, which feeds $WF_6$, $SiH_4$, etc. as process gases into the process chamber in order to form a metallic film of W or WSi on a wafer. Further, the process apparatus is provided with an exhaust system, which is connected to an exhaust port of the process chamber. The exhaust system serves to decompress the process chamber by suction, thereby setting the interior of the chamber at a given degree of vacuum, e.g., 1 Torr to 80 Torr.

In the film-forming process using the process apparatus of this type, the wafer is fixedly positioned on the susceptor as its peripheral edge portion is pressed against the susceptor by means of a clamp ring. If the metallic film is formed on the wafer with the peripheral edge portion of the wafer pressed by the clamp ring, however, the wafer edge portion inevitably involves areas that remain unaffected by any film.

To cope with this, there is a method in which film formation is achieved by placing the wafer in a depressed section that is provided in the susceptor, instead of fixing the wafer by means of the clamp ring. According to this method, the process chamber is evacuated and decompressed with the wafer simply placed in the depressed section. The wafer is heated indirectly by means of halogen lamps or the like as $WF_6$, $SiH_4$, etc. are supplied from a showerhead, and a metallic film of W or WSi is formed on the wafer. If the wafer is subjected to the film-forming process or the like in a manner such that it is simply placed on the susceptor without being fixed thereto, as in this method, however, it may possibly slightly move on the susceptor when the pressure in the process chamber is changed. If the pressure in the process chamber is lowered, for example, from several Torr or more to 1 Torr or less by means of a vacuum pump, the wafer may be dislocated by, for example, 1 to 2 mm, in some cases. Possibly, such dislocation may result in errors in wafer transportation.

BRIEF SUMMARY OF THE INVENTION

The object of the present invention is to provide a susceptor capable of preventing an object to be processed from being dislocated as the pressure in a process chamber varies.

The above object of the invention can be achieved by a susceptor constructed as follows. The susceptor is set in a process chamber for subjecting an object to a specific process and can bear the object thereon. The susceptor comprises: a stepped section for defining a recessed bearing region capable of bearing the object therein and positioning the object on the susceptor; and at least one groove formed in the bearing region and used to allow a gas remaining in a gap between the object and that part of the susceptor which includes the stepped section to get out of the bearing region.

That is, the susceptor comprising: a disk-like member having, at one major surface, an object bearing region surrounded with bearing region defining means, the object bearing region having at least one groove formed in that major surface and having a portion exposed to an inside of the process chamber with the object placed on the object bearing region. In other words, the susceptor comprising: a disk-like member having, at one major surface, an object bearing region surrounded with bearing region defining means, the object bearing region having at least one groove in that major surface, the disk-like member having a gas passage communicating at one end with the groove and at the other end opened at other than the object bearing region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The inventors hereof examined the cause of dislocation of an object to be processed on a susceptor in a process chamber observed as the pressure in the process chamber varies. Thereupon, the inventors reached the conclusion that the dislocation occurs as a very small quantity of gas remaining in a gap between the object and the susceptor expands and pushes up the object when the process chamber is decompressed. To cope with this, according to the invention, grooves communicating with the outside of the susceptor are formed in that surface region of the susceptor on which the object is placed, whereby the object is prevented from being pushed up by the gas. Thus, if the infinitesimal residual gas in the gap between the object and the susceptor is expanded when the pressure in the process chamber is changed, e.g., when the process chamber is decompressed by means of a vacuum pump, the expanded gas is discharged to the outside of the susceptor through the grooves in the surface of the susceptor. Accordingly, the object on the susceptor cannot be dislocated by the gas that expands. An embodiment of the present invention will now be described with reference to the accompanying drawings.

Figure 1:
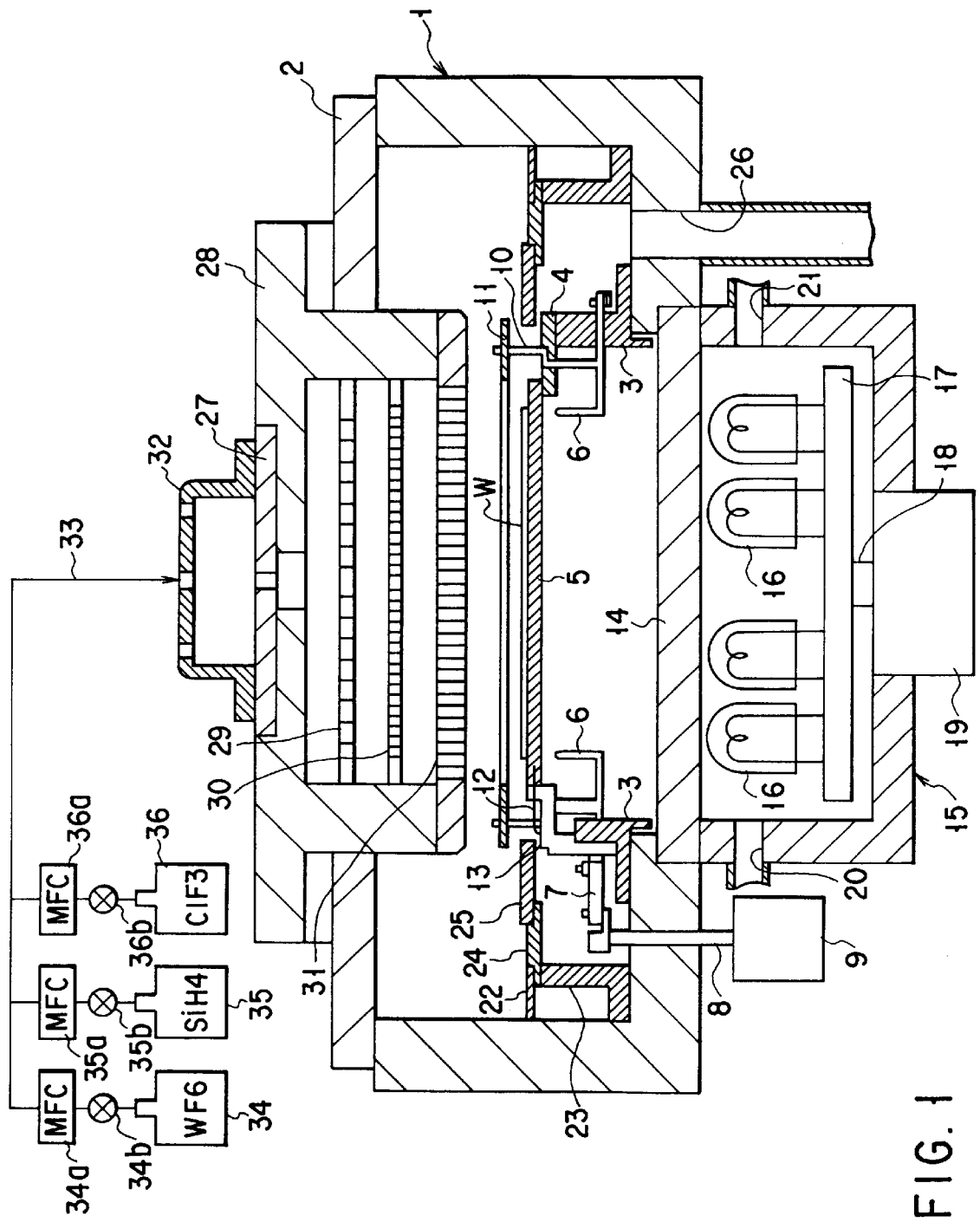
FIG. 1 is a schematic sectional view of a CVD film-forming apparatus furnished with a susceptor according to an embodiment of the present invention.

FIG. 1 is a sectional view schematically showing a CVD film-forming apparatus. As shown in FIG. 1, this apparatus comprises a cylindrical or box-shaped process chamber 1 that is formed of aluminum, for example. A lid 2 is provided on the top of the chamber 1. A stage unit for a wafer W (object to be processed) is disposed in the process chamber 1. The stage unit includes a susceptor 5 on which the wafer W is placed. The susceptor 5 is set on a support member 3, which rises from the base of the chamber 1, by means of a retaining member 4. The inner surface of the support member 3 is designed to reflect heat rays. The susceptor 5 is formed of a carbon material or ceramics, for example, and its thickness is adjusted to about 2 mm.

Lifter pins 6, e.g., three in number, for lifting the wafer W from the susceptor 5 are arranged under the susceptor 5. The pins 6 are supported on a pusher rod 8 by means of a retaining member 7, the rod 8 being coupled to an actuator 9. Thus, when the actuator 9 raises or lowers the pusher rod 8, the pins 6 are caused to move up or down by the rod 8 and the retaining member 7, whereupon the wafer W ascends or descends. The lifter pins 6 are formed of quartz or some other material that is permeable to heat rays. A shield ring 11 is attached to a support member 10 that is formed integrally with the lifter pins 6. The ring 11 serves to prevent heat rays from halogen lamps (mentioned later) from being applied upward and secure a passage for a cleaning gas during cleaning operation. Embedded in the susceptor 5, moreover, is a thermocouple 12 for measuring the temperature of the wafer W being heated. The support member 3 is fitted with a retaining member 13 for retaining the thermocouple 12.

A permeable window 14, formed of quartz or some other material that is permeable to heat rays, is airtightly attached to the base portion of the process chamber 1 right under the susceptor 5. A box-shaped heating chamber 15 is located under the window 14 so as to surround it. In the heating chamber 15, halogen lamps 16, e.g., four in number, are mounted on a rotating table 17 that doubles as a reflector. The table 17 is rotated about a rotating shaft 18 by means of a motor 19, which is attached to the base of the heating chamber 15. Thus, the heat rays emitted from the lamps 16 can be applied to the undersurface of the susceptor 5 through the permeable window 14, thereby heating it. Two opposite side walls of the heating chamber 15 are provided with a cooling air inlet port 20 and a cooling air outlet port 21, individually. Cooling air for cooling the interior of the chamber 1 15 and the window 14 is introduced through the inlet port 20 and discharged through the outlet port 21.

On the outer peripheral side of the susceptor 5, a ring-shaped distributor plate 22 having a large number of distributing holes is placed on a water-cooled plate 24, which is mounted on the upper end of a ring-shaped support column 23. Provided on the inner peripheral side of the plate 24 is a ring-shaped attachment 25 of quartz or aluminum for preventing process gases on the upper-stream side from flowing downward. In a film-forming process, an inert gas, such as nitrogen gas, which does not react with the process gases, is supplied as a backside gas to the region under the distributor plate 22, water-cooled plate 24, and attachment 25. By doing this, the process gases are prevented from getting under the susceptor 5 and producing an extra film-forming effect.

An exhaust port 26 is provided at each of the four corners of the base of the process chamber 1, and a vacuum pump (not shown) is connected to the port 26. Thus, the interior of the process chamber 1 can be kept at a degree of vacuum of 100 Torr to $10^{-6}$ Torr, for example.

The ceiling section of the process chamber 1 is provided with a gas supply section through which the process gases, cleaning gas, etc. are introduced. The gas supply section is composed of a shower base 28 fitted in the lid 2. An orifice plate 27 for the passage of the process gases and the like is provided on the central portion of the top of the shower base 28. Further, two shower plates 29 and 30 are arranged in tiers under the orifice plate 27, and a showerhead 31 is provided under the plates 29 and 30. Process gas sources 34 and 35 for $WF_6$ and $SiH_4$ and a cleaning gas source 36 for $ClF_3$ are connected to gas inlet ports 32 over the orifice plate 27 by means of a gas passage 33. Flow control valves 34a, 35a and 36a and on-off valves 34b, 35b and 36b are inserted in the gas passage 33.

Figure 2:
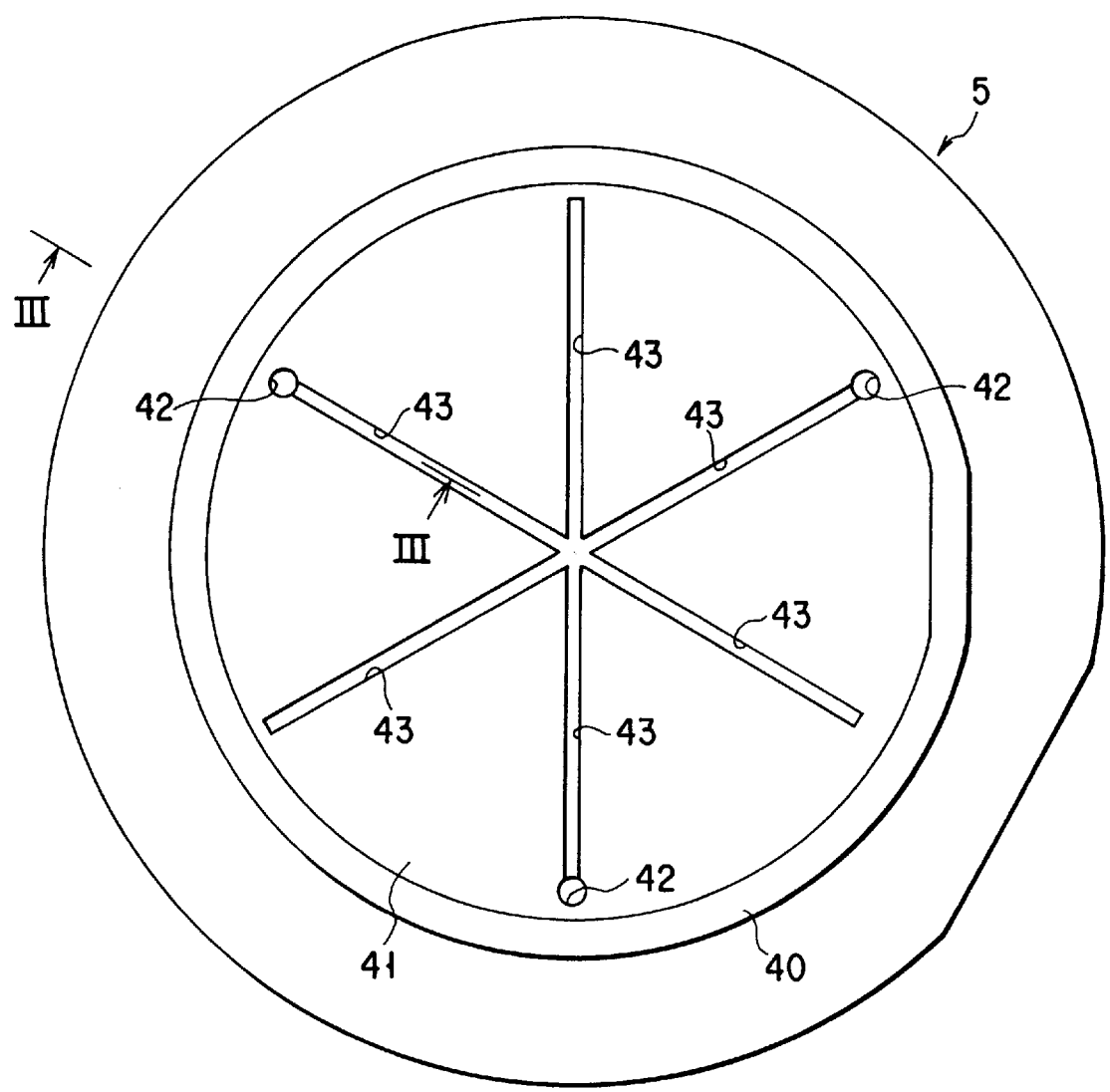
FIG. 2 is a plan view of the susceptor shown in FIG. 1.
Figure 3:
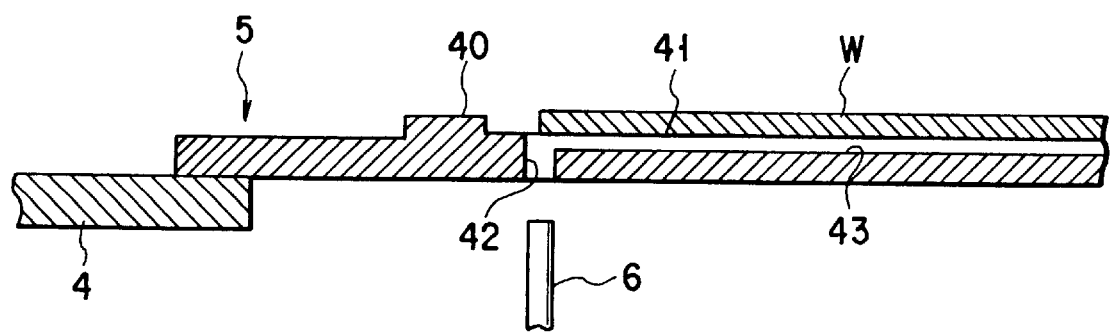
FIG. 3 is a sectional view taken along line III—III of FIG. 2.

Referring now to FIGS. 2 and 3, the susceptor 5 of the stage unit will be described. FIG. 2 is a plan view of the susceptor shown in FIG. 1, and FIG. 3 is a sectional view taken along line III—III of FIG. 2.

As shown in FIGS. 2 and 3, a ring-shaped ridge 40 is formed just inside the outer peripheral end of the susceptor 5. A flat depressed section 41 is formed inside the ridge 40 in a manner such that it is a little lower than the ridge 40. The wafer W is placed in the depressed section 41. The ridge 40, along with the depressed section 41, defines a recessed bearing region for the wafer W, whereby the wafer W is positioned on the susceptor 5. A defining means of the bearing region may be so formed that a plurality of ridges are located around the bearing region. Three guide holes 42 for the lifter pins 6 are formed penetrating the susceptor 5 in the outer peripheral portion of the depressed section 41. Further, the depressed section 41 is formed having six grooves 43 that extend radially from its central portion. Three of the six grooves 43 communicate with their corresponding guide holes 42 at their respective outer ends in the radial direction.

The following is a description of the way a metallic film is formed on the surface of the wafer W by using the CVD film-forming apparatus with the construction described above. First, a gate valve (not shown) attached to a partition wall of the process chamber 1 is opened, and the wafer W is carried into the chamber 1 by means of a transfer arm. Then, the wafer W is delivered to the lifter pins 6, which protrude upward from the susceptor 5, by means of the transfer arm. Thereafter, the pusher rod 8 is moved down to lower the pins 6, whereupon the wafer W is placed on the susceptor 5.

Subsequently, the process chamber 1 is evacuated through the exhaust port 26 to a given degree of vacuum between 0.1 Torr and 80 Torr, for example. In this state, $WF_6$ and $SiH_4$ gases as the process gases are fed into the process chamber 1 through the shower plates 29 and 30 and the showerhead 31. In this case, the $WF_6$ and $SiH_4$ gases are supplied at 5 to 100 SCCM and 10 to 300 SCCM, respectively. At the same time, the halogen lamps 16 in the heating chamber 15 are rotated in an on-state, and the heat rays from the lamps are applied to the susceptor 5.

According to the present embodiment, the grooves 43 are formed in the surface of the susceptor 5 under the wafer W, and they communicate with the backside of the susceptor 5 through the guide holes 42. If a very small quantity of gas remaining in a gap between the wafer W and the susceptor 5 is expanded as the process chamber 1 is decompressed for the vacuum extraction, therefore, the expanded gas is discharged toward the backside of the susceptor 5 through the grooves 43 and the guide holes 42. That is, the guide holes 42 also serve as gas passage to allow a gas in the groove 43 to escape. Accordingly, the wafer W on the susceptor 5 cannot be dislocated when the pressure in the process chamber 1 is changed.

The grooves 43 are arranged in the radial direction of the susceptor 5. The groove is 1 to 5 mm wide×0.25 to 1.0 mm deep. Therefore, the gas expanded between the wafer W and the susceptor 5 can easily escape through the grooves 43. According to the present embodiment, the guide holes 42 for the lifter pins 6 are used also as vertical holes through which the gas is discharged, so that it in unnecessary to form any special holes for preventing the dislocation of the wafer W.

Figure 4:
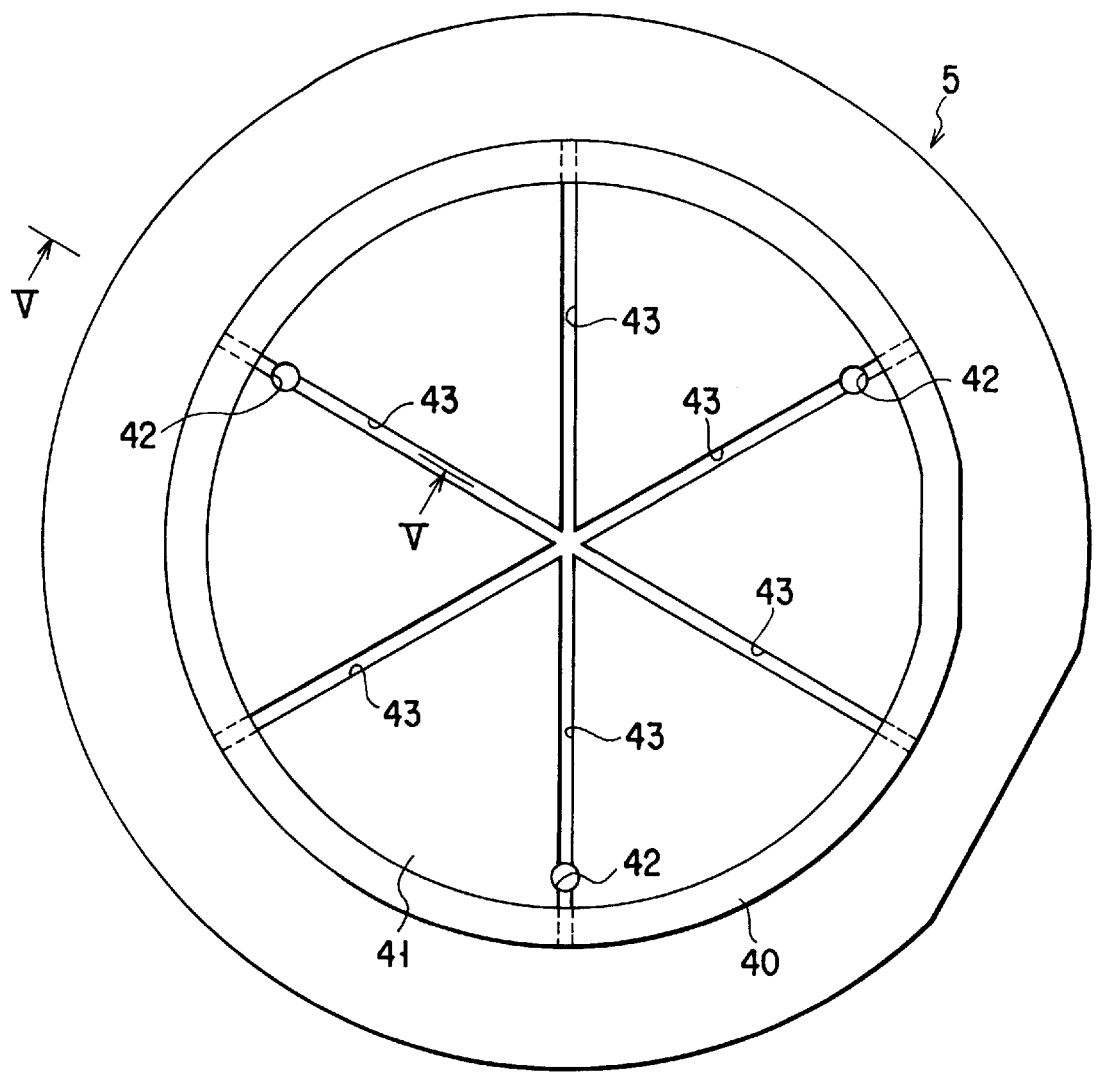
FIG. 4 is a plan view showing a modification of the susceptor of FIG. 2.
Figure 5:
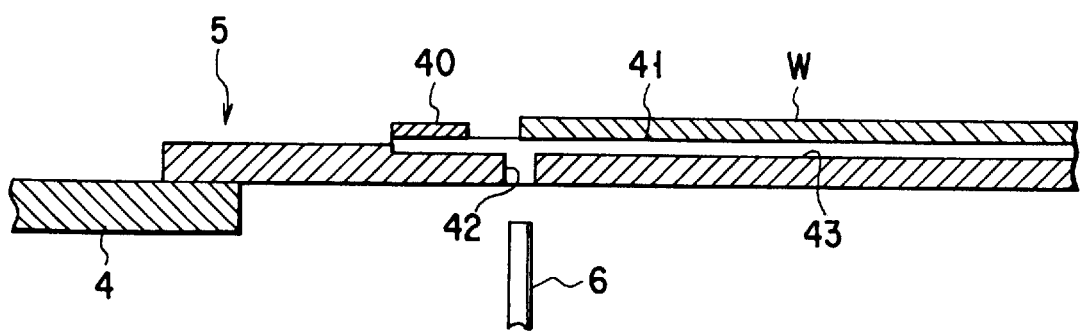
FIG. 5 is a sectional view taken along line V—V of FIG. 4.

FIGS. 4 and 5 show a modification of the embodiment described above. In this modification, the grooves 43 extend penetrating the ridge 40. According to this arrangement, the gas remaining in the gap between the wafer W and the susceptor 5 can get out in more ways of escape. Thus, the expanded gas can be discharged more easily and quickly than in the case of the aforementioned embodiment.

It is to be understood that the present invention is not limited to the embodiment described above, and that various changes and modifications may be effected therein by one skilled in the art without departing from the scope or spirit of the invention. For example, the object to be processed is not limited to a wafer. Further, the material of the metallic film to be formed is not limited to tungsten, and may alternatively be Ti (titanium), TiN (titanium nitride), TiSi (titanium silicide) or some other metal or metallic compound. Moreover, the process apparatus is not limited to a thermal CVD apparatus and may alternatively be a plasma CVD apparatus. Furthermore, the process apparatus is not limited to a film-forming apparatus and may be any other suitable apparatus, such as an etching apparatus.

According to the embodiment described above, moreover, the guide holes 42 for the lifter pins 6 are designed to communicate with their corresponding grooves 43. Instead of using the guide holes 42, however, separate vertical holes that communicate individually with the grooves 43 may be formed penetrating the susceptor 5. Further, the gases need not be discharged to the backside of the susceptor. As in the case of the modification shown in FIGS. 4 and 5, the grooves may be extended to the outer peripheral end of the susceptor so that the gases can be discharged sideways to the outside of the susceptor. That is, it is only necessary that a portion of the groove or an opening of the gas passage communicating with the groove is exposed to an inner space in the process chamber.

The grooves are arranged radially according to the embodiment described herein. However, the arrangement of the grooves is not limited to any special configuration only if they allow the discharge of the gases. For example, the grooves may be also arranged like a lattice.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A susceptor set in a process chamber for subjecting an object to a specific process and capable of bearing the object thereon, comprising:

a disk member having one major surface providing an object bearing region;

at least one groove formed in the object bearing region and used to allow a gas remaining in a gap between the object and the susceptor to get out of the bearing region;

a plurality of through holes penetrating the disk member and communicating with the groove; and a plurality of lifter pins, wherein said lifter pins are situated in the through holes and capable of supporting the object above the object bearing region, and wherein said lifter pins are capable of being moved up and down through the through holes.

2. The susceptor according to claim 1, wherein said groove extends radially from the central portion of the bearing region.

3. A susceptor set in a pressure-reducible process chamber for subjecting an object to a specific process and capable of bearing the object thereon, comprising:

a disk member having:
     a major surface;
     an object bearing region formed on the major surface, the object bearing region having at least one continuous groove having:
       a portion that is covered by the object placed on the object bearing region; and
       a portion that is not covered by the object placed on the object bearing region.

4. The susceptor according to claim 3, further comprising a plurality of through holes penetrating the disk member and communicating with the groove.

5. The susceptor according to claim 4, further comprising lifter pins capable of supporting the object above the bearing region, wherein said lifter pins are capable of being moved up and down through the through holes.

6. An apparatus comprising:

a process chamber for subjecting an object to a specific process in a specific vacuum atmosphere; and a susceptor set in the process chamber and capable of bearing the object thereon, wherein the susceptor includes a disk member having:
     a major surface;
     an object bearing region formed on the major surface, said object bearing region includes a groove having:
       a portion that is covered by the object placed on the object bearing region; and
       a portion that is not covered by the object placed on the object bearing region.

7. The apparatus according to claim 6, wherein said groove extends radially from the central portion of the bearing region.

8. The apparatus according to claim 6, further comprising a plurality of through holes penetrating the susceptor and communicating with the groove.

9. The apparatus according to claim 8, further comprising lifter pins capable of supporting the object above the bearing region, said lifter pings are capable of being moved up and down through the through holes.

* * * * *